United States Patent
Moon et al.

(10) Patent No.: US 9,207,361 B2
(45) Date of Patent: *Dec. 8, 2015

(54) COMPOSITION FOR POLARIZING FILM, AND POLARIZING FILM AND DISPLAY DEVICE

(71) Applicant: SAMSUNG ELECTRONICS CO., LTD., Suwon-si, Gyeonggi-do (KR)

(72) Inventors: Deuk Kyu Moon, Seoul (KR); Sang Ho Park, Anyang-si (KR); Yong Joo Lee, Suwon-si (KR); Ha Na Kim, Seongnam-si (KR); Tae-Rae Kim, Seoul (KR); Beom Seok Kim, Seoul (KR); Jong Hoon Won, Yongin-si (KR); Myung Sup Jung, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 112 days.

This patent is subject to a terminal disclaimer.

(21) Appl. No.: 14/210,997

(22) Filed: Mar. 14, 2014

(65) Prior Publication Data

US 2015/0124320 A1    May 7, 2015

(30) Foreign Application Priority Data

Nov. 6, 2013   (KR) .................. 10-2013-0134391

(51) Int. Cl.
*F21V 9/14* (2006.01)
*G02B 5/30* (2006.01)
(Continued)

(52) U.S. Cl.
CPC ............... *G02B 1/08* (2013.01); *G02B 5/3025* (2013.01); *G02F 1/133528* (2013.01); *H01L 51/5293* (2013.01)

(58) Field of Classification Search
USPC ............. 252/585; 264/1.34; 349/96; 428/220
See application file for complete search history.

(56) References Cited

U.S. PATENT DOCUMENTS 6,743,487 B2   6/2004   Sakai et al.
7,300,687 B2   11/2007  Sakai et al.
(Continued)

FOREIGN PATENT DOCUMENTS

FR   WO2011157614   * 12/2011  ............. C09B 31/28
JP   2003-096461 A    4/2003
(Continued)

OTHER PUBLICATIONS

A.T.Slark, "Application of the Kwei equation to the glass transition of dye solute-polymer blends", Polymer, vol. 40, 1999, pp. 1935-1941.
(Continued)

*Primary Examiner* — Bijan Ahvazi
(74) *Attorney, Agent, or Firm* — Cantor Colburn LLP

(57) ABSTRACT

A composition for a polarizing film including a polyolefin and a dichroic dye represented by Chemical Formula 1:

Chemical Formula 1

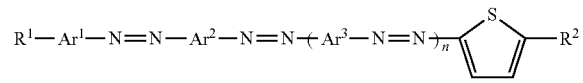

wherein, in Chemical Formula 1, $Ar^1$ to $Ar^3$, $R^1$, $R^2$, and n are defined in the detailed description.

18 Claims, 4 Drawing Sheets

(51) Int. Cl.
    *G02C 7/12*     (2006.01)
    *G02F 1/1335*     (2006.01)
    *G02B 1/08*     (2006.01)
    *H01L 51/52*     (2006.01)
    *B29D 7/01*     (2006.01)

(56) References Cited

U.S. PATENT DOCUMENTS

| | | | |
|---|---|---|---|
| 2002/0128341 A1 | 9/2002 | Sakai et al. | |
| 2004/0166250 A1 | 8/2004 | Sakai et al. | |
| 2011/0051052 A1 | 3/2011 | Tasaka et al. | |
| 2011/0075076 A1* | 3/2011 | Nishiguchi et al. | 349/96 |
| 2012/0050652 A1* | 3/2012 | Chang et al. | 349/96 |
| 2013/0092874 A1 | 4/2013 | Bacher et al. | |

FOREIGN PATENT DOCUMENTS

| | | |
|---|---|---|
| JP | 2011-048309 A | 3/2011 |
| JP | 2011-048310 A | 3/2011 |
| JP | 2011-048311 A | 3/2011 |
| KR | 10-0852224 B | 8/2008 |
| WO | 2011157614 A1 | 12/2011 |

OTHER PUBLICATIONS

Darvishmanesh et al., "Physicochemical Characterization of Solute Retention in Solvent Resistant Nanofiltration: The Effect of Solute Size, Polarity, Dipole Moment, and Solubility Parameter", The Journal of Physical Chemistry, B, vol. 115, 2011, pp. 14507-14517.

Sarfraz A. Siddiqui, "Studies of solvent Dyeing—Part I: Preparation of Disperse Dyes and Determination of Their solubility Parameters", Textile Research Journal, Aug. 1981, pp. 527-533.

Srivastava et al., "Thermal and morphological studies of liquid crystalline materials dispersed in a polymer matrix", Liquid Crystals, vol. 38, No. 7, Jul. 2011, pp. 849-859.

* cited by examiner

COMPOSITION FOR POLARIZING FILM, AND POLARIZING FILM AND DISPLAY DEVICE

CROSS-REFERENCE TO RELATED APPLICATIONS

This application claims priority to Korean Patent Application No. 10-2013-0134391 filed in the Korean Intellectual Property Office on Nov. 6, 2013, and all the benefits accruing therefrom under 35 U.S.C. §119, the content of which is incorporated herein in its entirety by reference.

BACKGROUND

1. Field

A composition for a polarizing film, a polarizing film, and a display device including the polarizing film are disclosed.

2. Description of the Related Art

A display device such as a liquid crystal display (LCD) and an organic light emitting diode (OLED) include a polarizing plate attached to the outside of a display panel. The polarizing plate only transmits a light of a specific wavelength and absorbs or reflects a light of other wavelengths, thereby controlling the direction of the incident light in the display panel or the light emitted from the display panel.

The polarizing plate generally includes a polarizer and a protective layer disposed on the polarizer. The polarizer may be formed of, for example, polyvinyl alcohol (PVA), and the protective layer may be formed of, for example, triacetyl cellulose (TAC).

However, the existing process of fabrication of the polarizing plate including the polarizer and the protective layer disposed on the polarizer is complex and incurs high production costs. In addition, the process ordinarily yields a thick polarizing plate which leads to an increased thickness of a display device.

Thus, to control the desired thickness of the display device, there remains a need in a polarizing film that does not require a protective layer.

SUMMARY

An embodiment provides a composition for a polarizing film with improved polarization properties.

Another embodiment provides a polarizing film manufactured from the composition for a polarizing film.

Yet another embodiment provides a display device including the polarizing film.

According to an embodiment, a composition for a polarizing film including a polyolefin and a dichroic dye represented by Chemical Formula 1 is provided.

Chemical Formula 1

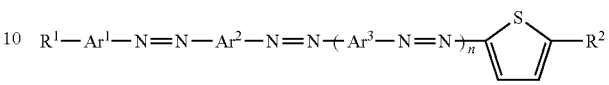

In Chemical Formula 1,
$Ar^1$ to $Ar^3$ are each independently a substituted or unsubstituted C6 to C15 arylene group, wherein
at least two of $Ar^1$ to $Ar^3$ are a substituted C6 to C15 arylene group substituted with at least one of a substituted or unsubstituted C1 to C20 alkyl group, a substituted or unsubstituted C1 to C20 alkoxy group, a halogen atom, or a halogen-containing group,
$R^1$ is a substituted or unsubstituted C1 to C30 alkyl group, a substituted or unsubstituted C1 to C20 alkoxy group, a substituted or unsubstituted C1 to C20 alkylthio group, a substituted or unsubstituted C1 to C30 alkanoyl group, a substituted or unsubstituted C1 to C30 alkoxycarbonyl group, a substituted or unsubstituted C2 to C20 alkenyl group, a substituted or unsubstituted C2 to C30 alkynyl group, or a combination thereof,
$R^2$ is hydrogen, a substituted or unsubstituted C1 to C30 alkyl group, a substituted or unsubstituted C6 to C20 aryl group, a substituted or unsubstituted C1 to C20 alkoxy group, a substituted or unsubstituted C1 to C20 alkylthio group, $-NR^3R^4$, or a combination thereof, wherein $R^3$ and $R^4$ are each independently hydrogen, a substituted or unsubstituted C1 to C10 alkyl group, optionally linked to each other to form a ring, and
n is 0 or 1.

$R^1$ of Chemical Formula 1 may be a substituted or unsubstituted C4 to C20 alkyl group or a substituted or unsubstituted C4 to C20 alkoxy group, and $R^2$ of Chemical Formula 1 may be hydrogen, a substituted or unsubstituted C1 to C30 alkyl group, $-NR^3R^4$, or a combination thereof, wherein $R^3$ and $R^4$ are each independently hydrogen, a substituted or unsubstituted C1 to C10 alkyl group, optionally linked to each other to form a ring.

The dichroic dye may be represented by one of Chemical Formulae 2 to 5.

Chemical Formula 2

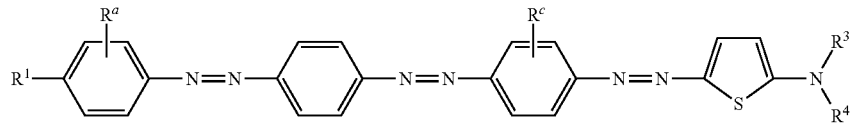

Chemical Formula 3

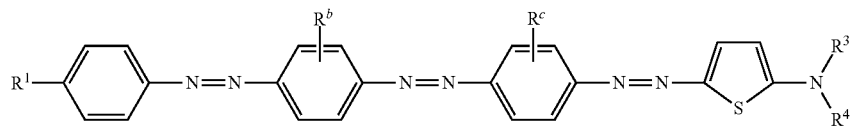

Chemical Formula 4

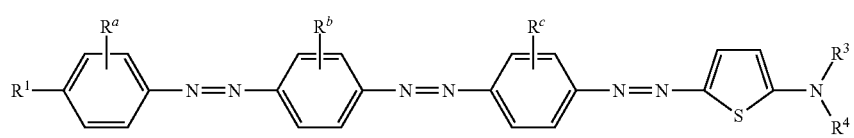

-continued

Chemical Formula 5

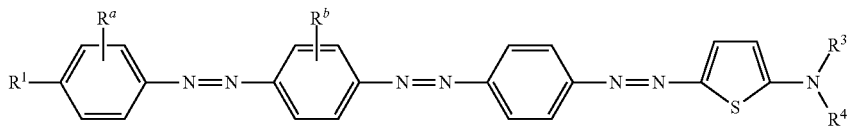

In Chemical Formulae 2 to 5, $R^1$ is a substituted or unsubstituted C1 to C30 alkyl group, a substituted or unsubstituted C1 to C20 alkoxy group, a substituted or unsubstituted C1 to C20 alkylthio group, a substituted or unsubstituted C1 to C30 alkanoyl group, a substituted or unsubstituted C1 to C30 alkoxycarbonyl group, a substituted or unsubstituted C2 to C20 alkenyl group, a substituted or unsubstituted C2 to C30 alkynyl group, or a combination thereof, $R^3$ and $R^4$ are each independently hydrogen, a substituted or unsubstituted C1 to C20 alkyl group, optionally linked to each other to form a ring, and $R^a$ to $R^c$ are each independently at least one of a substituted or unsubstituted C1 to C20 alkyl group, a substituted or unsubstituted C1 to C20 alkoxy group, a halogen atom, or a halogen-containing group.

The dichroic dye may be represented by Chemical Formulae 2a to 4c.

The polyolefin may include polyethylene, polypropylene, a copolymer thereof, or a combination thereof.

The polyolefin may be a combination of polypropylene and a polyethylene-polypropylene copolymer, and a weight ratio of the polypropylene and the polyethylene-polypropylene copolymer in the combination may be about 4:6 to about 6:4.

The polyolefin may have a solubility parameter of about 15 to about 18, and the dichroic dye may have a solubility parameter of less than or equal to about 26.

According to another embodiment, a polarizing film including a polyolefin and the dichroic dye represented by Chemical Formula 1 is provided.

The polarizing film may have a dichroic ratio of about 5 to about 10 at a maximum absorption wavelength ($\lambda_{max}$) in a visible ray region, wherein the dichroic ratio may be obtained by Equation 1:

$$DR = \text{Log}(1/T_\perp)/\text{Log}(1/T_\parallel) \qquad \text{Equation 1}$$

Chemical Formula 2a

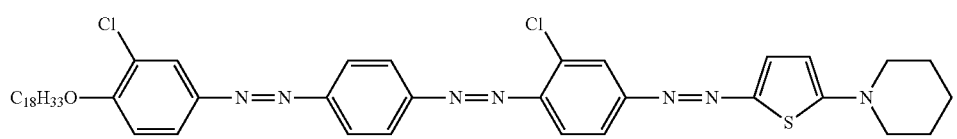

Chemical Formula 3a

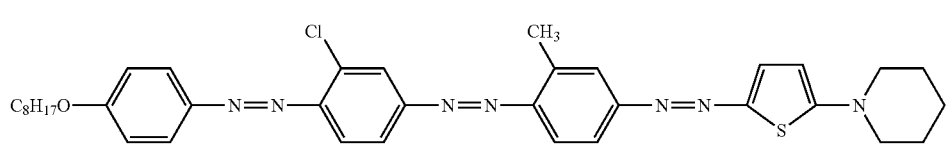

Chemical Formula 4a

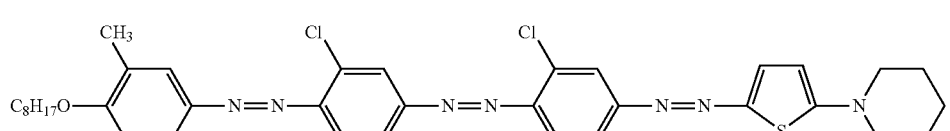

Chemical Formula 4b

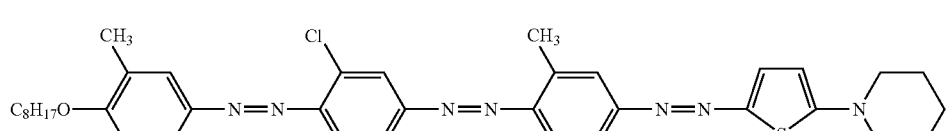

Chemical Formula 4c

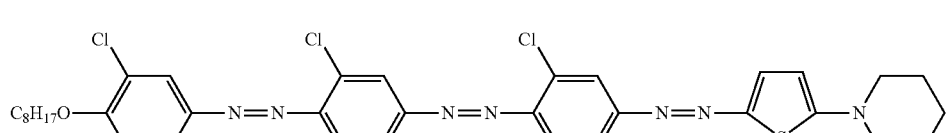

In Equation 1,

DR denotes a dichroic ratio of a polarizing film, $T_\parallel$ is transmittance of light entering parallel to the transmissive axis of a polarizing film, and $T_\perp$ is transmittance of light entering perpendicular to the transmissive axis of the polarizing film.

The polarizing film may be a melt blend of the polyolefin and the dichroic dye.

According to yet another embodiment, a display device including a display panel and the polarizing film positioned on at least one side of the display panel is provided.

The display panel may be an organic light emitting display panel, a liquid crystal display panel, or a combination thereof.

DETAILED DESCRIPTION

Figure 1:
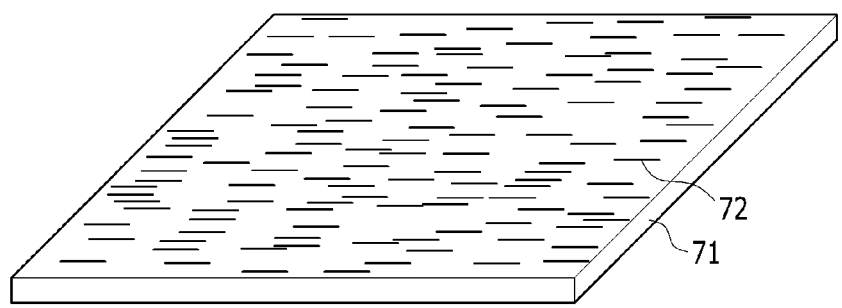
FIG. 1 is schematic view of a polarizing film according to an embodiment.

Exemplary embodiments will hereinafter be described in detail, and may be routinely performed by those who have common knowledge in the related art. However, this disclosure may be embodied in many different forms and is not construed as limited to the exemplary embodiments set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, the term "substituted" refers to one substituted with at least one substituent selected from a halogen (F, Br, Cl, or I), a C1 to C20 alkoxy group, a cyano group, an amino group, a C1 to C20 ester group, a C1 to C20 alkyl group, a C1 to C20 aryl group, a C2 to C20 alkenyl group, a C2 to C20 alkynyl group, and a combination thereof.

As used herein, when a definition is not otherwise provided, the term "alkyl" indicates a group derived from a completely saturated, branched or unbranched (or a straight or linear) hydrocarbon. Non-limiting examples of the "alkyl" group include methyl, ethyl, n-propyl, isopropyl, n-butyl, isobutyl, sec-butyl, t-butyl, iso-pentyl, neo-pentyl, iso-amyl, n-hexyl, 3-methylhexyl, 2,2-dimethylpentyl, 2,3-dimethylpentyl, and n-heptyl.

As used herein, when a definition is not otherwise provided, the term "alkoxy" represents "alkyl-O—", wherein the term "alkyl" has the same meaning as described above. Non-limiting examples of the alkoxy group are methoxy, ethoxy, propoxy, 2-propoxy, n-butoxy, sec-butoxy, t-butoxy, pentyloxy, hexyloxy, cyclopropoxy, and cyclohexyloxy.

As used herein, when a definition is not otherwise provided, the term "alkylthio" represents "alkyl-S—", wherein the term "alkyl" has the same meaning as described above. Non-limiting examples of the alkylthio group are methylthio, ethylthio, propylthio, 2-propylthio, n-butylthio, sec-butylthio, t-butylthio, pentylthio, hexylthio, cyclopropylthio, and cyclohexylthio.

As used herein, when a definition is not otherwise provided, the term "alkanoyl" represents "alkyl-C(=O)—", wherein the term "alkyl" has the same meaning as described above. Non-limiting examples of the alkoxy group are methanoyl, ethanoyl, propanoyl, 2-propanoyl, n-butanoyl, sec-butanoyl, t-butanoyl, pentanoyl, hexanoyl, cyclopropanoyl, and cyclohexanoyl.

As used herein, when a definition is not otherwise provided, the term "alkanoyl" represents "alkyl-C(=O)O—", wherein the term "alkyl" has the same meaning as described above. Non-limiting examples of the alkoxy group are methanoyloxy, ethanoyloxy, propanoyloxy, 2-propanoyloxy, n-butanoyloxy, sec-butanoyloxy, t-butanoyloxy, pentanoyloxy, hexanoyloxy, cyclopropanoyloxy, and cyclohexanoyloxy.

As used herein, when a definition is not otherwise provided, the term "halogen atom" indicates fluorine, bromine, chloride, or iodine.

As used herein, when a definition is not otherwise provided, the term "halogen-containing group" indicates any group including at least one halogen atom.

As used herein, when a definition is not otherwise provided, the term "alkenyl" indicates a group derived from a branched or unbranched hydrocarbon with at least one carbon-carbon double bond. Non-limiting examples of the alkenyl group include vinyl, n-propenyl, n-butenyl, iso-propenyl, and iso-butenyl.

As used herein, when a definition is not otherwise provided, the term "alkynyl" indicated a group derived from a branched or unbranched hydrocarbon with at least one carbon-carbon triple bond. Non-limiting examples of the "alkynyl" group include ethynyl, n-propynyl, n-butynyl, iso-butynyl, and iso-propynyl.

As used herein, when a definition is not otherwise provided, the term "aryl" group, which is used alone or in combination, indicates an aromatic hydrocarbon containing at least one ring. The term "aryl" is construed as including a group with an aromatic ring fused to at least one cycloalkyl ring. Non-limiting examples of the "aryl" group are phenyl, naphthyl, and tetrahydronaphthyl.

As used herein, when a definition is not otherwise provided, the term "arylene" indicates a divalent group respectively derived from the "aryl" group.

Hereinafter, a composition for a polarizing film according to an embodiment is described.

The composition for a polarizing film according to an embodiment includes a polyolefin and a dichroic dye.

The polyolefin may be a polymer, which may be melt-blended and formed into a film, and may have average light transmittance of greater than or equal to about 85% in a visible ray region.

The polyolefin may be, for example polyethylene (PE), polypropylene (PP), a copolymer thereof, or a combination thereof. The polyolefin may be, for example, a mixture of at least two polymers selected from polyethylene (PE), polypropylene (PP), and a copolymer thereof, and may be, for example a mixture of polypropylene (PP) and a polyethylene-polypropylene copolymer (PE-PP).

The polypropylene (PP) may have, for example, a melt flow index (MFI) of about 0.1 grams/10 minutes to about 5 grams/10 minutes. Herein, the melt flow index (MFI) shows the amount of a polymer in a melt state flowing per 10 minutes, and relates to viscosity of the polymer in a melted state. In other words, the lower the melt flow index (MFI) is, the higher the viscosity of the polymer, while the higher the melt flow index (MFI) is, the lower the viscosity of the polymer. When the polypropylene (PP) has a melt flow index (MFI) within the above range, the desired properties of a final product as well as its workability may be effectively improved. In an embodiment, the polypropylene (PP) may have a melt flow index (MFI) ranging from about 0.5 grams/10 minutes to about 5 grams/10 minutes.

The polyethylene-polypropylene copolymer (PE-PP) may include about 1 percent by weight (wt %) to about 50 wt % of an ethylene group based on the total amount of the copolymer. When the polyethylene-polypropylene copolymer (PE-PP) includes the ethylene group within the above range, phase separation of the polypropylene and the polyethylene-polypropylene copolymer (PE-PP) may be effectively prevented or suppressed. In addition, the polyethylene-polypropylene copolymer (PE-PP) may have improved elongation rate during elongation, excellent light transmittance, and alignment, as well as improved polarization properties. In an embodiment, the polyethylene-polypropylene copolymer (PE-PP) may include an ethylene group in an amount of about 1 wt % to about 25 wt % based on the total amount of the copolymer.

The polyethylene-polypropylene copolymer (PE-PP) may have a melt flow index (MFI) ranging from about 5 grams/10 minutes to about 15 grams/10 minutes. When the polyethylene-polypropylene copolymer (PE-PP) has a melt flow index (MFI) within the above range, the desired properties of a final product as well as its workability may be effectively improved. In an embodiment, the polyethylene-polypropylene copolymer (PE-PP) may have a melt flow index (MFI) ranging from about 10 grams/10 minutes to about 15 grams/10 minutes.

When the polyolefin is a mixture of the polypropylene (PP) and the polyethylene-polypropylene copolymer (PE-PP), the polypropylene (PP) and the polyethylene-polypropylene copolymer (PE-PP) may be present in a weight ratio of about 1:9 to about 9:1. When the polypropylene (PP) and the polyethylene-polypropylene copolymer (PE-PP) are included within the above range, the polypropylene may be prevented from crystallizing and may have excellent mechanical strength, thereby effectively improving its haze characteristics. In an embodiment, the polymer may include the polypropylene (PP) and the polyethylene-polypropylene copolymer (PE-PP) in a weight ratio of about 4:6 to about 6:4, for example, in a weight ratio of about 5:5.

The polyolefin may have a melt flow index (MFI) ranging from about 1 gram/10 minutes to about 15 grams/10 minutes. When the polyolefin has a melt flow index (MFI) within the above range, the crystals in the polyolefin are not excessively formed, so the polyolefin may not only secure excellent light transmittance, but also have appropriate viscosity for manufacturing a film having improved workability. In an embodiment, the polyolefin may have a melt flow index (MFI) ranging from about 5 grams/10 minutes to about 15 grams/10 minutes.

The polyolefin may have haze ranging from less than or equal to about 5%. When the polyolefin has haze within the range, transmittance may be increased, and thus excellent optical properties may be secured. In an embodiment, the polyolefin may have haze of less than or equal to about 2%, for example, about 0.5% to about 2%.

The polyolefin may have crystallinity of less than or equal to about 50%. When the polyolefin has crystallinity within the above range, the polyolefin may have lower haze and excellent optical properties. In an embodiment, the polyolefin may have crystallinity of about 30% to about 50%.

The polyolefin may be replaced by another polymer having similar physical optical properties. For example, the polyolefin may be replaced by a transparent polymer having a melting point of greater than or equal to about 130° C. and crystallinity of less than or equal to about 50%, and may be replaced by, for example, a polyester such as polyethylene terephthalate (PET), polyethylene terephthalate glycol (PETG), and polyethylene naphthalate (PEN).

The dichroic dye may be a compound represented by the following Chemical Formula 1.

Chemical Formula 1

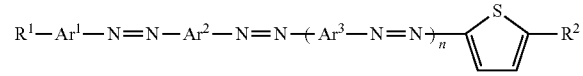

In the above Chemical Formula 1, $Ar^1$ to $Ar^3$ are each independently a substituted or unsubstituted C6 to C15 arylene group, wherein at least two of $Ar^1$ to $Ar^3$ are a substituted C6 to C15 arylene group substituted with at least one of a substituted or unsubstituted C1 to C20 alkyl group, a substituted or unsubstituted C1 to C20 alkoxy group, a halogen atom, or a halogen-containing group, $R^1$ is a substituted or unsubstituted C1 to C30 alkyl group, a substituted or unsubstituted C1 to C20 alkoxy group, a substituted or unsubstituted C1 to C20 alkylthio group, a substituted or unsubstituted C1 to C30 alkanoyl group, a substituted or unsubstituted C1 to C30 alkoxycarbonyl group, a substituted or unsubstituted C2 to C20 alkenyl group, a substituted or unsubstituted C2 to C30 alkynyl group, or a combination thereof, $R^2$ is hydrogen, a substituted or unsubstituted C1 to C30 alkyl group, a substituted or unsubstituted C6 to C20 aryl group, a substituted or unsubstituted C1 to C20 alkoxy group, a substituted or unsubstituted C1 to C20 alkylthio group, $-NR^3R^4$, or a combination thereof, wherein $R^3$ and $R^4$ are each independently hydrogen, a substituted or unsubstituted C1 to C10 alkyl group, optionally linked to each other to form a ring, and n is 0 or 1.

$R^1$ of the above Chemical Formula 1 may be a substituted or unsubstituted C4 to C20 alkyl group or a substituted or unsubstituted C4 to C20 alkoxy group, and $R^2$ of the above Chemical Formula 1 may be, for example, hydrogen, a substituted or unsubstituted C1 to C30 alkyl group, $-NR^3R^4$, or a combination thereof, wherein $R^3$ and $R^4$ are each independently hydrogen, a substituted or unsubstituted C1 to C10 alkyl group, optionally linked to each other to form a ring.

In the above Chemical Formula 1, $Ar^1$ to $Ar^3$ may each independently be, for example, a substituted or unsubstituted phenylene group, a substituted or unsubstituted naphthalene group, or a substituted or unsubstituted biphenylene group, wherein at least two of $Ar^1$ to $Ar^3$ are a phenylene group, a naphthalene group, or a biphenylene group substituted with at least one of a substituted or unsubstituted C1 to C20 alkyl group, a substituted or unsubstituted C1 to C20 alkoxy group, a halogen atom, or a halogen-containing group.

For example, the dichroic dye may be a compound where $Ar^1$ and $Ar^3$ are each independently a phenylene group substituted with at least one of a substituted or unsubstituted C1 to C20 alkyl group, a substituted or unsubstituted C1 to C20 alkoxy group, a halogen atom, or a halogen-containing group, and may be, for example a compound represented by the following Chemical Formula 2.

Chemical Formula 2

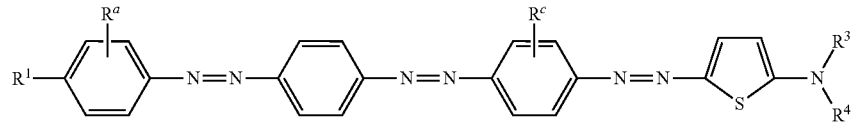

In the above Chemical Formula 2, $R^1$, $R^3$, and $R^4$ are the same as described above, and $R^a$ and $R^c$ are each independently at least one of a substituted or unsubstituted C1 to C20 alkyl group, a substituted or unsubstituted C1 to C20 alkoxy group, a halogen atom, or a halogen-containing group.

For example, the dichroic dye may be a compound where $Ar^2$ and $Ar^3$ are each independently a phenylene group substituted with at least one of a substituted or unsubstituted C1 to C20 alkyl group, a substituted or unsubstituted C1 to C20 alkoxy group, a halogen atom, or a halogen-containing group, and may be, for example, a compound represented by the following Chemical Formula 3.

Chemical Formula 3

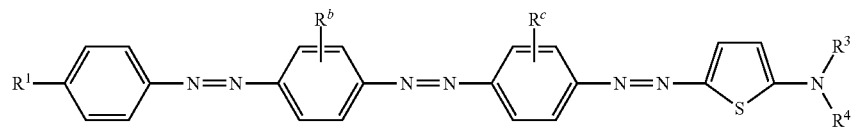

In the above Chemical Formula 3, $R^1$, $R^3$, and $R^4$ are the same as described above, and $R^b$ and $R^c$ are each independently at least one of a substituted or unsubstituted C1 to C20 alkyl group, a substituted or unsubstituted C1 to C20 alkoxy group, a halogen atom, or a halogen-containing group.

For example, the dichroic dye may be a compound where $Ar^1$, $Ar^2$, and $Ar^3$ are each independently a phenylene group substituted with at least one of a substituted or unsubstituted C1 to C20 alkyl group, a substituted or unsubstituted C1 to C20 alkoxy group, a halogen atom, or a halogen-containing group, and may be, for example, a compound represented by the following Chemical Formula 4.

Chemical Formula 4

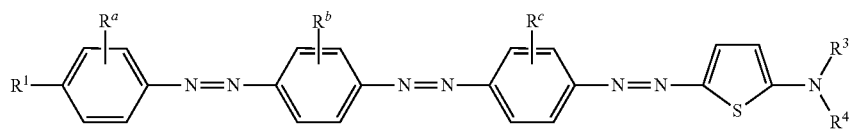

In the above Chemical Formula 4, $R^1$, $R^3$, and $R^4$ are the same as described above, and $R^a$ to $R^c$ are each independently at least one of a substituted or unsubstituted C1 to C20 alkyl group, a substituted or unsubstituted C1 to C20 alkoxy group, a halogen atom, or a halogen-containing group.

For example, the dichroic dye may be a compound where $Ar^1$ and $Ar^2$ are a phenylene group substituted with at least one of a substituted or unsubstituted C1 to C20 alkyl group, a substituted or unsubstituted C1 to C20 alkoxy group, a halogen atom, or a halogen-containing group, and may be, for example, a compound represented by the following Chemical Formula 5.

In the above Chemical Formula 5, $R^1$, $R^3$, and $R^4$ are the same as described above, and $R^a$ and $R^b$ are each independently at least one of a substituted or unsubstituted C1 to C20 alkyl group, a substituted or unsubstituted C1 to C20 alkoxy group, a halogen atom, or a halogen-containing group.

The dichroic dye may be represented by, for example, the following Chemical Formulae 2a to 4c.

Chemical Formula 5

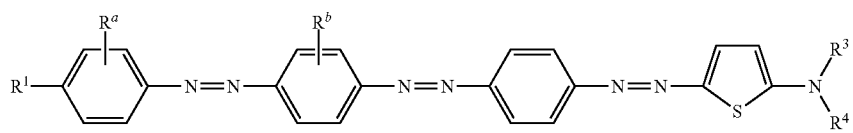

Chemical Formula 2a

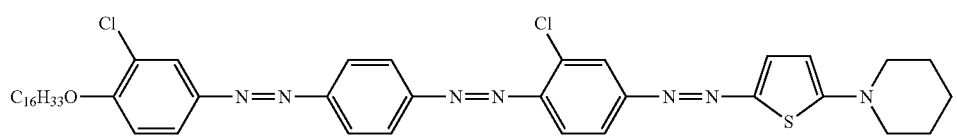

Chemical Formula 3a

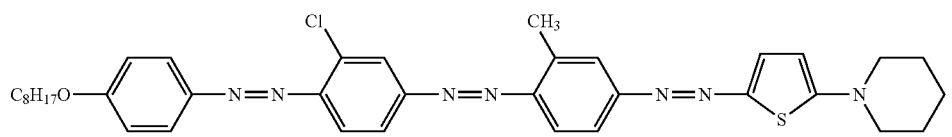

Chemical Formula 4a

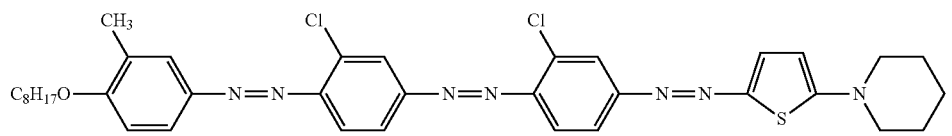

Chemical Formula 4b

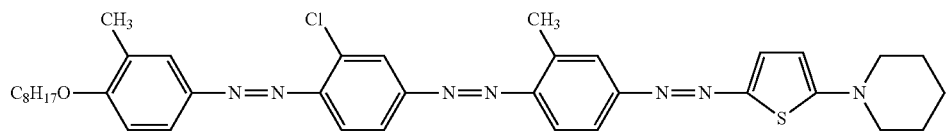

Chemical Formula 4c

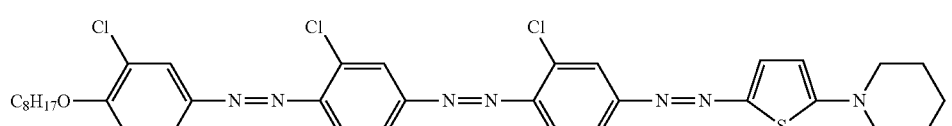

One or two kinds of the dichroic dye may be mixed.

A solubility parameter difference between the polyolefin and the dichroic dye may be less than about 7.4. The solubility parameter indicates an interaction degree to which two or more compounds interact. The smaller solubility parameter difference the compounds have, the larger interaction they have, while the larger solubility parameter difference the compounds have, the smaller interaction they have.

The solubility parameter has a relation with the structure of a compound. When the dichroic dye and the polyolefin have a solubility parameter difference within the range, the polyolefin and the dichroic dye have high interaction during the manufacture of a polarizing film, and may increase the melt-mixing property and thus may prevent agglomeration of the dichroic dyes and uniformly disperse the dichroic dye in the polyolefin.

A solubility parameter difference between the polyolefin and the dichroic dye may be less than or equal to about 7.0, or less than or equal to about 6.7.

The solubility parameter of the polyolefin may be, for example about 15 to about 18, and in this case, the solubility parameter of the dichroic dye may be, for example less than about 24.

The thermal decomposition temperature of the dichroic dye may be greater than or equal to about 245° C. Herein, the decomposition temperature indicates a temperature at which the weight of the dichroic dye decreases by about 5% relative to its initial weight.

The dichroic dye may be included in an amount of about 0.01 to about 5 parts by weight based on 100 parts by weight of the polyolefin. When the dichroic dye is included within the range, sufficient polarization properties may be obtained without deteriorating transmittance of a polarizing film. Within the above range, the dichroic dye may be included in an amount of about 0.05 to about 1 part by weight based on 100 parts by weight of the polyolefin.

The composition for a polarizing film may include the polyolefin and the dichroic dye, wherein each of the polyolefin and the dichroic dye may be a solid such as a powder. The composition for a polarizing film may include, for example, a solid content of greater than or equal to about 90 wt %, and for example, may not include a solvent.

The polarizing film may be manufactured by melt-blending and elongating the composition for a polarizing film at a temperature of greater than or equal to the melting point (Tm) of the polyolefin. For example, the polarizing film may be manufactured by a process including melt-blending the composition for a polarizing film to prepare a melt-blend, putting the melt-blend into a mold and pressing it into a sheet, and elongating the sheet in a uniaxial direction.

The melt-blending may be performed at a temperature of less than or equal to about 300° C., for example, ranging from about 130 to about 300° C.

The sheet may be formed by putting the melt blend in the mold, and pressing it with a high pressure or discharging it in a chill roll through a T-die.

The elongation in a uniaxial direction may be performed at a temperature ranging from about 25 to about 200° C. at an elongation rate ranging from about 400% to about 1,000%. The elongation rate refers to a length ratio of after the elongation to before the elongation of the sheet, and means the elongation extent of the sheet after uniaxial elongation.

Hereinafter, a polarizing film obtained from the composition for the polarizing film is described referring to drawings.

FIG. 1 is a schematic view showing a polarizing film according to an embodiment.

Referring to FIG. 1, a polarizing film 70 according to an embodiment includes a polyolefin 71 and a dichroic dye 72.

The polyolefin 71 is elongated in a uniaxial direction, and the direction may be the length direction of the dichroic dye 72.

The dichroic dye 72 is dispersed into the polyolefin 71 and aligned in the elongation direction of the polyolefin 71. The dichroic dye 72 is a material that transmits one perpendicular polarization component of the two mutually perpendicular polarization components in a predetermined wavelength region.

The polyolefin 71 and dichroic dye 72 are respectively the same as described above.

The polarizing film 70 may be a melt-blend of the polyolefin 71 and the dichroic dye 72. The melt-blend may be obtained by melt-blending the above-described composition for a polarizing film at a temperature of greater than or equal to the melting point (Tm) of the polyolefin 71.

The polarizing film 70 may have a dichroic ratio of about 5 at a maximum absorption wavelength ($\lambda_{max}$) of a visible ray region. Within the range, the dichroic ratio may be about 5 to about 10. Herein, the dichroic ratio may be calculated by dividing plane polarization absorbance in a vertical direction with the axis of a polymer by polarization absorbance in a horizontal direction according to the following Equation 1.

$$DR = Log(1/T_\perp)/Log(1/T_\parallel) \qquad \text{Equation 1}$$

In Equation 1,

DR denotes a dichroic ratio of a polarizing film, $T_\parallel$ is light transmittance of light entering parallel to the transmissive axis of a polarizing film, and $T_\perp$ is light transmittance of light entering perpendicular to the transmissive axis of the polarizing film.

The dichroic ratio shows to what degree the dichroic dye 72 is arranged in the polarizing film 70 in one direction. When the polarizing film 70 has a dichroic ratio within the range in the visible ray wavelength region, the dichroic dye 72 is arranged according to arrangement of the polymer chains, improving polarization properties of the polarizing film 70.

The polarizing film 70 may have polarization efficiency of greater than or equal to about 90%, for example, ranging from about 95% to about 100% within the range. Herein, the polarization efficiency may be obtained by the following Equation 2.

$$PE (\%) = [(T_\parallel - T_\perp)/(T_\parallel + T_\perp)]^{1/2} \times 100 \qquad \text{Equation 2}$$

In Equation 2,

PE denotes polarization efficiency, $T_\parallel$ is transmittance of light entering parallel to the transmissive axis of a polarizing film, and $T_\perp$ is transmittance of light entering perpendicular to the transmissive axis of the polarizing film.

The polarizing film 70 may have light transmittance of greater than or equal to about 30%, for example, ranging from about 30% to about 95% within the range. When the polarizing film 70 having light transmittance within the ranges above is applied to one side of a display device, light emitting from the display device may not be prevented.

The polarizing film 70 may have a relative thin thickness of less than or equal to about 100 μm, for example about 30 μm to about 95 μm. When the polarizing film 70 has a thickness within the range, it may be significantly thinner than a polarizing plate requiring a protective layer such as triacetyl cellulose (TAC) and contribute to realizing a thin display device.

The polarizing film may be applied to various display devices.

The display device may be a liquid crystal display (LCD).

Figure 2:
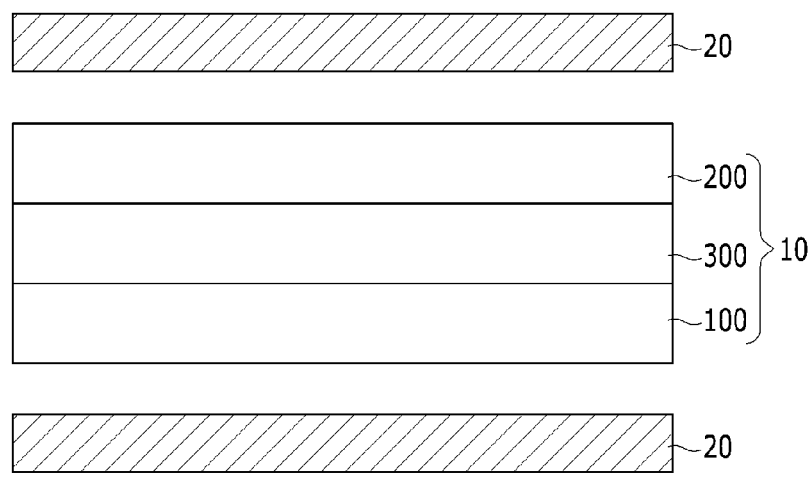
FIG. 2 is a cross-sectional view showing a liquid crystal display (LCD) according to an embodiment.

FIG. 2 is a cross-sectional view showing a liquid crystal display (LCD) according to an embodiment.

Referring to FIG. 2, the liquid crystal display (LCD) includes a liquid crystal display panel 10 and a polarizing film 20 disposed on both the lower part and the upper part of the liquid crystal display panel 10.

The liquid crystal display panel 10 may be a twist nematic (TN) mode panel, a patterned vertical alignment (PVA) mode panel, an in-plane switching (IPS) mode panel, an optically compensated bend (OCB) mode panel, and the like.

The liquid crystal display panel 10 includes a first display plate 100, a second display plate 200, and a liquid crystal layer 300 interposed between the first display plate 100 and the second display plate 200.

The first display plate 100 may include, for example, a thin film transistor (not shown) formed on a substrate (not shown), and a first electric field generating electrode (not shown) connected thereto. The second display plate 200 may include, for example, a color filter (not shown) formed on the substrate and a second electric field generating electrode (not shown). However, it is not limited thereto, and the color filter may be included in the first display plate 100, and both the first electric field generating electrode and the second electric field generating electrode may be disposed in the first display plate 100.

The liquid crystal layer 300 may include a plurality of liquid crystal molecules. The liquid crystal molecules may have positive or negative dielectric anisotropy. When the liquid crystal molecules have positive dielectric anisotropy, the long axis thereof may be aligned substantially parallel to the surface of the first display plate 100 and the second display plate 200 when an electric field is not applied, and may be aligned substantially perpendicular to the surface of the first display plate 100 and the second display plate 200 when an electric field is applied. On the contrary, when the liquid crystal molecules have negative dielectric anisotropy, the long axis thereof may be aligned substantially perpendicular to the surface of the first display plate 100 and the second display plate 200 when an electric field is not applied, and may be aligned substantially parallel to the surface of the first display plate 100 and the second display plate 200 when an electric field is applied.

The polarizing film 20 is disposed on the outside of the liquid crystal display panel 10. Although it is shown to be disposed on the upper part and lower part of the liquid crystal display panel 10 in the drawing, it may be formed on either the upper part or the lower part of the liquid crystal display panel 10.

The polarizing film 20 is the same as described above.

The display device may be an organic light emitting diode (OLED) display.

Figure 3:
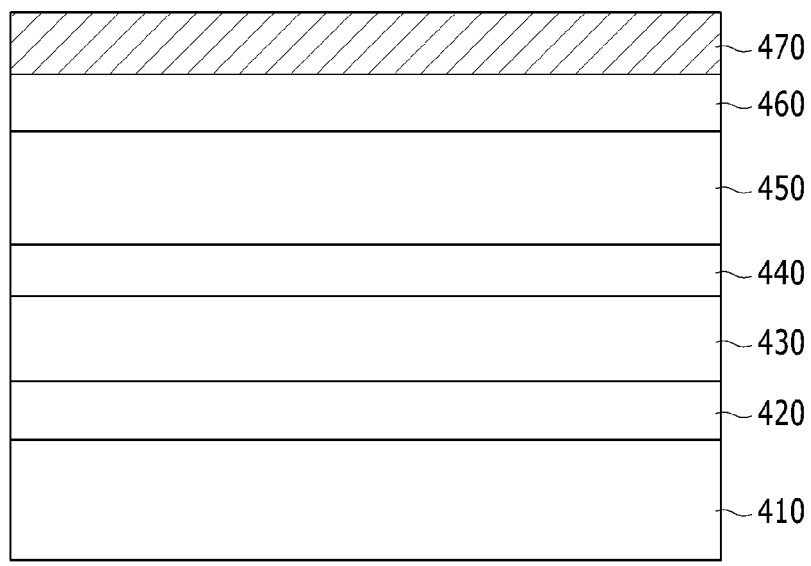
FIG. 3 is a cross-sectional view showing an organic light emitting diode (OLED) display according to an embodiment.

FIG. 3 is a cross-sectional view showing an organic light emitting diode (OLED) display according to an embodiment.

Referring to FIG. 3, an organic light emitting diode (OLED) display according to an embodiment includes a base substrate 410, a lower electrode 420, an organic emission layer 430, an upper electrode 440, an encapsulation substrate 450, a compensation film 460, and a polarizing film 470.

The base substrate 410 may be formed of glass or plastic.

Either of the lower electrode 420 and the upper electrode 440 may be an anode, while the other is a cathode. The anode is an electrode where holes are injected, and is formed of a transparent conductive material having a high work function and externally transmitting entered light, for example, ITO or IZO. The cathode, an electrode where electrons are injected, is formed of a conducting material having a low work function and having no influence on an organic material, which is selected from, for example, aluminum (Al), calcium (Ca), and barium (Ba).

The organic emission layer 430 includes an organic material emitting light when a voltage is applied between the lower electrode 420 and the upper electrode 440.

An auxiliary layer (not shown) may be included between the lower electrode 420 and the organic emission layer 430, and between the upper electrode 440 and the organic emission layer 430. The auxiliary layer may include a hole transport layer for balancing electrons and holes, a hole injection layer (HIL), an electron injection layer (EIL), and an electron transport layer.

The encapsulation substrate 450 may be made of glass, metal, or a polymer. The lower electrode 420, the organic emission layer 430, and the upper electrode 440 are sealed to prevent moisture and/or oxygen from flowing in.

The compensation film 460 may circularly polarize light passing through the polarizing film 470 and generate a phase difference, and thus have an influence on reflection and absorption of the light. The compensation film 460 may be, for example, a phase difference film such as $\lambda/4$ plate, and may be omitted depending on the case.

The polarizing film 470 may be disposed at a light-emitting side. For example, the polarizing film 470 may be disposed outside of the base substrate 410 in a bottom emission type in which light emits from the base substrate 410, and outside of the encapsulation substrate 450 in a top emission type in which light emits from the encapsulation substrate 450.

The polarizing film 470 is the same as described above.

The compensation film 460 and polarizing film 470 may be disposed at a display screen of an organic light emitting diode (OLED) display and thus may play a role of an antireflective film preventing reflection of light flowing in from the outside. The antireflective film may prevent visibility deterioration due to the light flowing in from the outside.

Hereinafter, the present disclosure is illustrated in more detail with reference to examples. However, these examples are for illustration purposes only, and the present disclosure is not limited thereto.

Synthesis of Dichroic Dye

SYNTHESIS EXAMPLE 1

1-1. Synthesis of Monoazo Compound 10 g (72.4 mmol) of 4-nitroaniline (Sigma-Aldrich) is dissolved in 500 mL of water and 48 mL of 12 N HCl, and another solution prepared by dissolving 5.49 g (79.6 mmol) of sodium nitrite ($NaNO_2$) in 100 mL of water is slowly added thereto in a dropwise fashion. When the addition in a dropwise fashion is complete, the reactant is agitated for one hour while being maintained at 0° C. Subsequently, 23.2 g of sodium hydroxide (NaOH) and 79.64 mmol of 2-chlorophenol are dissolved in 100 mL of methanol and 50 mL of water, the solution is slowly added to the reaction mixture in a dropwise fashion, and the resulting mixture is agitated at 0° C. for one hour. Subsequently, the reactant is neutralized by a sodium hydroxide (NaOH) aqueous solution to complete the reaction, and a solid precipitated therein is filtered. This solid compound is washed several times with water and dried, obtaining a monoazo compound. The yield of the monoazo compound is 70%.

10 g (18.01 mmol) of the monoazo compound is dissolved in 200 mL of acetone, and 6.34 g (19.8 mmol) of 1-iodohexadecane and 12.4 g (90.1 mmol) of potassium carbonate ($K_2CO_3$) are added thereto. Subsequently, the reaction mixture is refluxed and agitated at 60° C. for 24 hours and cooled down to room temperature. The reaction mixture is then concentrated, and a solid precipitated therein is washed several times with water and filtered, obtaining 7.3 g (14.5 mmol) of a 4-nitro compound. The yield of the 4-nitro compound is 81%.

7.1 g (14.0 mmol) of the purified 4-nitro compound is dissolved in 300 mL of hot ethanol, and 6.7 g (28.0 mmol) of $Na_2S.9H_2O$ dissolved in hot ethanol and water is added thereto. The reaction mixture is agitated at 80° C. for 5 hours and cooled down to room temperature. Subsequently, a crystal precipitated therein is filtered, washed several times with water, and dried, obtaining 5.5 g (11.7 mmol) of 3'-chloro-4-amino-4'-hexadecaneoxyazobenzene. The yield of the product is 83%.

1-2. Synthesis of Disazo Compound 2.4 g (5 mmol) of the obtained 3'-chloro-4-amino-4'-hexadecaneoxyazobenzene is dissolved in 100 mL of acetic acid (AcOH), 2.33 g (12.5 mmol) of 2-chloro-4-nitro-1-nitrosobenzene is added thereto, and the mixture is agitated at 40° C. for 12 hours. Subsequently, a solid crystal precipitated therein is filtered, washed several times with water, and dried, obtaining 2.4 g of a disazo compound with a yield of 75%.

2 g (3.12 mmol) of the synthesized disazo compound is dissolved in 50 mL of hot ethanol, and 1.5 g (6.24 mmol) of $Na_2S.9H_2O$ dissolved in hot ethanol and water is added thereto. Subsequently, the reaction mixture is agitated at 80° C. for 5 hours and cooled down to room temperature. A crystal precipitated therein is filtered, washed several times with water, and dried, obtaining 2",3'-dichloro-4"-amino-4'-hexadecanoxydiazobenzene with a yield of 63%.

1-3. Synthesis of Triazo Compound 1 mmol of the disazo compound is dissolved in 20 mL of dimethylformamide (DMF) and 5 mL of acetic acid (AcOH), 0.5 mL of 12 N HCl is added thereto, and the mixture is maintained at 0° C. Subsequently, 72 mg (1.04 mmol) of sodium nitrite ($NaNO_2$) is dissolved in 1 mL of water, and the solution is slowly added to the reaction mixture in a dropwise fashion. When the addition in a dropwise fashion is complete, the reactant is maintained at 0° C. and agitated for one hour. Then, 167 mg (1 mmol) of 1-(thien-2-yl)-piperidine is dissolved in 25 mL of methanol and 2 mL of dimethylformamide (DMF), the mixture is slowly added to the reaction mixture in a dropwise fashion, and the mixture is agitated at 0° C. for one hour. Subsequently, the reactant is neutralized by using a sodium hydroxide (NaOH) aqueous solution to complete the reaction, and a solid precipitated therein is filtered. The mixture is purified through silica gel column chromatography (n-hexane:EtOAc=3:1), obtaining 600 mg (0.76 mmol) of a dichroic dye represented by the following Chemical Formula 2a. The yield of the dye is 76%.

The structure of the dichroic dye represented by the above Chemical Formula 2a is analyzed by $^1$H NMR (300 MHz, Bruker Co.).

The $^1$H NMR analysis result is provided as follows.

$^1$H NMR (300 MHz. $CDCl_3$) δ(ppm): 0.81 (t, J=6.9 Hz, 3 H, $CH_3$), 1.12-1.39 (m, 24 H, $CH_2$×12), 1.43-1.45 (m, 2 H, $CH_2$), 1.66 (s, 6 H, $CH_2$×3), 1.77-1.87 (m, 2 H, $CH_2$), 3.40 (t, J=5.4 Hz, 4 H, $NCH_2$), 4.06 (t, J=6.6 Hz, 2 H, $OCH_2$), 6.18 (d, J=4.8 Hz, 1 H, ArH), 6.98 (d, J=9.0 Hz, 1 H, ArH), 7.58-7.78 (m, 2 H, ArH), 7.78-7.85 (m, 3 H, ArH), 7.92-7.97 (m, 3 H, ArH), 8.0-8.06 (m, 2 H, ArH).

SYNTHESIS EXAMPLE 2

2-1. Synthesis of Monoazo Compound 10 g (57.9 mmol) of 2-chloro-4-nitroaniline (Sigma-Aldrich) is dissolved in 500 mL of water and 38 mL of 12 N HCl, and another solution prepared by dissolving 4.4 g (63.74 mmol) of sodium nitrite ($NaNO_2$) in 100 mL of water is slowly added thereto in a dropwise fashion. When the addition in a dropwise fashion is complete, the reactant is agitated for one hour while being maintained at 0° C. Subsequently, 18.54 g of sodium hydroxide (NaOH) and 63.74 mmol of phenol are dissolved in 100 mL of methanol and 50 mL of water, the solution is added to the reaction mixture in a dropwise fashion, and the resulting mixture is agitated at 0° C. for one hour. The reactant is then neutralized by using a sodium hydroxide (NaOH) aqueous solution to complete the reaction, and a solid precipitated therein is filtered. The solid compound is washed several times with water and dried, obtaining a monoazo compound. The yield of the compound is 70%.

20 mmol of the monoazo compound is dissolved in 200 mL of acetone, and 22 mmol of 1-bromooctane and 100 mmol of potassium carbonate ($K_2CO_3$) are added thereto. Subsequently, the reaction mixture is refluxed and agitated at 60° C. for 24 hours, and then cooled down to room temperature. Then, the reaction mixture is concentrated, and a solid precipitated therein is washed several times and filtered, obtaining 7 g (17.9 mmol) of an octyloxy monoazo compound. The yield of the compound is 90%.

9.75 g (25.0 mmol) of the purified octyloxy monoazo compound is dissolved in 300 mL of hot ethanol, and 12.0 g (50.0 mmol) of $Na_2S.9H_2O$ dissolved in hot ethanol and water is added thereto. Subsequently, the reaction mixture is agitated at 80° C. for 5 hours and cooled down to room temperature. A solid precipitated therein is filtered and washed several times and then dried, obtaining 7 g (19.5 mmol) of 2-chloro-4-amino-4'-octyloxyazobenzene. A yield of the compound is 77.8%.

2-2. Synthesis of Disazo Compound 3.6 g (10 mmol) of the 2-chloro-4-amino-4'-octyloxyazobenzene is dissolved in 80 mL of dimethylformamide (DMF) and 20 mL of acetic acid (AcOH), 3.3 mL of 12 N HCl is added thereto, and the mixture is maintained at 0° C. Subsequently, 760 mg (11 mmol) of sodium nitrite ($NaNO_2$) is dissolved in 10 mL of water, and the solution is slowly Chemical Formula 2a

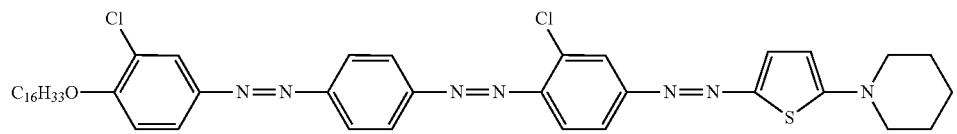

added to the reaction mixture in a dropwise fashion. When the addition in a dropwise fashion is complete, the reactant is agitated while being maintained at 0° C. Then, 1.18 g (11 mmol) of m-toluidine is dissolved in 20 mL of methanol, the solution is slowly added to the mixture in a dropwise fashion, and the obtained mixture is agitated at 0° C. for one hour. Subsequently, the reactant is neutralized by using a sodium hydroxide (NaOH) aqueous solution to complete the reaction, and a solid precipitated therein is filtered. This solid compound is washed several times and dried, obtaining a disazo compound. The yield of the compound is 60%.

2-3. Synthesis of Triazo Compound 400 mg (0.61 mmol) of a dichroic dye represented by the following Chemical Formula 3a is obtained according to the same method as the method of obtaining the disazo compound in Synthesis Example 1 The yield of the compound is 61%.

The structure of the dichroic dye represented by the above Chemical Formula 4a is analyzed by $^1$H NMR (300 MHz, Bruker Co.).

The $^1$H NMR analysis result is provided as follows.

$^1$H NMR (300 MHz. CDCl$_3$) δ(ppm): 0.9 (t, J=6.8 Hz, 3 H, CH$_3$), 1.29-1.41 (m, 8 H, CH$_2$×4), 1.48-1.56 (m, 2 H, CH$_2$), 1.78 (s, 6 H, CH$_2$×3), 1.81-1.96 (m, 2 H, CH$_2$), 2.3 (s, 3 H, CH$_3$), 3.52 (s, 4 H, NCH$_2$), 4.08 (t, J=6.5 Hz, 2H, OCH$_2$), 6.28 (d, J=4.5 Hz, 1 H, ArH), 6.95 (d, J=8.7 Hz, 1 H, ArH), 7.61-7.69 (m, 2 H, ArH), 7.80-7.89 (m, 6 H, ArH), 8.18 (s, 1 H, ArH).

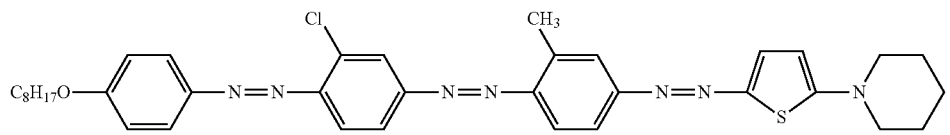

Chemical Formula 3a

The structure of the dichroic dye represented by Chemical Formula 3a is analyzed by $^1$H NMR (300 MHz, Bruker Co.).

The $^1$H NMR analysis result is provided as follows.

$^1$H NMR (300 MHz. CDCl$_3$) δ(ppm): 0.89 (t, J=6.8 Hz, 3 H, CH$_3$), 1.27-1.40 (m, 8 H, CH$_2$×4), 1.45-1.53 (m, 2H, CH$_2$), 1.69-1.79 (m, 6H, CH$_2$×3), 1.80-1.86 (m, 2H, CH$_2$), 2.73 (s, 3H, CH$_3$), 3.47 (s, 4H, NCH$_2$), 4.06 (t, J=6.5 Hz, 2H, OCH$_2$), 6.20 (s, 1 H, ArH), 7.03 (d, J=9.0 Hz, 1H, ArH), 7.59 (d, J=4.6 Hz, 1 H, ArH), 7.72-7.92 (m, 5H, ArH), 8.01 (d, J=8.9 Hz, 2H, ArH), 8.1 (d, J=1.5 Hz, 1H, ArH).

SYNTHESIS EXAMPLE 3

3-1. Synthesis of Monoazo Compound 7.3 g (19.52 mmol) of a monoazo compound is synthesized according to the same method as Synthesis Example 2, except for using 2-methylphenol instead of phenol. The yield of the compound is 78%.

3-2. Synthesis of Disazo Compound 1 g (1.95 mmol) of a disazo compound is synthesized according to the same method as the method of synthesizing the monoazo compound in Synthesis Example 1. The yield of the compound is 62.5%.

3-3. Synthesis of Triazo Compound

The disazo compound is synthesized in the same method as Synthesis Example 1, obtaining 380 mg (0.55 mmol) of a dichroic dye represented by the following Chemical Formula 4a. The yield of the compound is 55%.

SYNTHESIS EXAMPLE 4

4-1. Synthesis of Monoazo Compound 7.3 g (19.5 mmol) of a monoazo compound is synthesized according to the same method as Synthesis Example 3. The yield of the compound is 78%.

4-2. Synthesis of Disazo Compound 2.2 g (4.5 mmol) of a disazo compound is synthesized according to the same method as the method of synthesizing the monoazo compound in Synthesis Example 2. The yield of the disazo compound is 45%.

4-3. Synthesis of Triazo Compound 230 mg (0.34 mmol) of a dichroic dye represented by the following Chemical Formula 4b is synthesized according to the same method as the method of synthesizing the disazo compound in Synthesis Example 1. The yield of the dichroic dye is 34.3%.

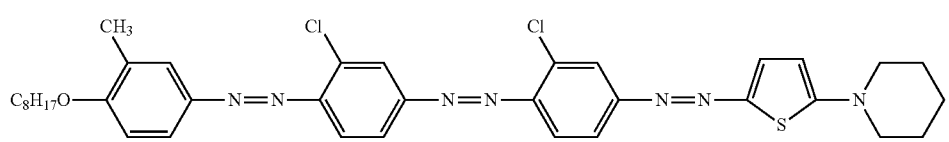

Chemical Formula 4a

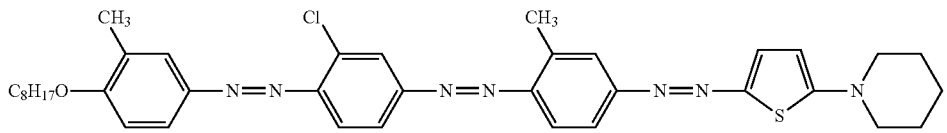

Chemical Formula 4b

The structure of the dichroic dye represented by the above Chemical Formula 4b is analyzed by $^1$H NMR (300 MHz, Bruker Co.).

The $^1$H NMR analysis result is provided as follows.

$^1$H NMR (300 MHz. CDCl$_3$) δ(ppm): 0.9 (t, J=6.6 Hz, 3 H, CH$_3$), 1.31-1.38 (m, 8 H, CH$_2$×4), 1.49-1.51 (m, 2 H, CH$_2$), 1.73 (s, 6 H, CH$_2$×3), 1.83-1.88 (m, 2 H, CH$_2$), 2.32 (s, 3H, CH$_3$), 2.80 (s, 3H, CH$_3$), 3.44 (t, J=5.6 Hz, 4 H, NCH$_2$), 4.07 (t, J=6.4 Hz, 2 H, OCH$_2$), 6.2 (d, J=4.7 Hz, 1 H, ArH), 6.95 (d, J=8.5 Hz, 1 H, ArH), 7.58-7.61 (m, 2 H, ArH), 7.67 (s, 1 H, ArH), 7.80-7.89 (m, 5 H, ArH), 8.08 (s, 1 H, ArH).

SYNTHESIS EXAMPLE 5

5-1. Synthesis of Monoazo Compound 8 g (20.3 mmol) of a monoazo compound is synthesized according to the same method as Synthesis Example 2, except for using 2-chlorophenol instead of phenol. The yield of the monoazo compound is 81%.

5-2. Synthesis of Disazo Compound 1.2 g (2.25 mmol) of a disazo compound is synthesized according to the same method as the method of synthesizing the monoazo compound in Synthesis Example 1. The yield of the compound is 72.2%.

5-3. Synthesis of Triazo Compound 590 mg (0.83 mmol) of a dichroic dye represented by the following Chemical Formula 4c is synthesized according to the same method as the method of synthesizing the disazo compound in Synthesis Example 1. The yield of the compound is 83%.

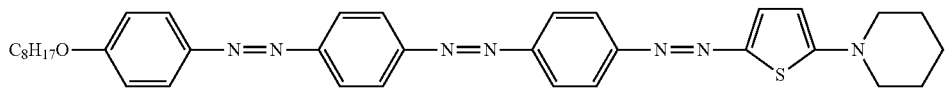

Chemical Formula 4c

The structure of the dichroic dye represented by the above Chemical Formula 4c is analyzed by $^1$H NMR (300 MHz, Bruker Co.).

The $^1$H NMR analysis result is provided as follows.

$^1$H NMR (300 MHz. CDCl$_3$) δ(ppm): 0.88 (t, J=6.7 Hz, 3 H, CH$_3$), 1.25-1.40 (m, 8 H, CH$_2$×4), 1.43-1.52 (m, 2 H, CH$_2$), 1.73 (s, 6 H, CH$_2$×3), 1.83-1.92 (m, 2 H, CH$_2$), 3.49 (s, 4 H, NCH$_2$), 4.12 (t, J=6.6 Hz, 2 H, OCH$_2$), 6.25 (s, 1 H, ArH), 7.05 (d, J=8.7 Hz, 1 H, ArH), 7.62 (br, 2 H, ArH), 7.80-7.94 (m, 5 H, ArH), 8.07 (d, J=2.4 Hz, 1 H, ArH), 8.13 (d, J=1.8 Hz, 1 H, ArH).

COMPARATIVE SYNTHESIS EXAMPLE 1

6-1. Synthesis of Monoazo Compound 3.5 g (10.8 mmol) of a monoazo compound is synthesized according to the same method as Synthesis Example 1, except for using phenol instead of 2-chlorophenol. The yield of the compound is 77%.

6-2. Synthesis of Disazo Compound 1.05 g (2.44 mmol) of a disazo compound is synthesized according to the same method as Synthesis Example 1 except for using 4-nitro-1-nitrosobenzene instead of 2-chloro-4-nitro-1-nitrosobenzene. The yield of the compound is 78.3%.

6-3. Synthesis of Triazo Compound 500 mg (0.82 mmol) of a dichroic dye represented by the following Chemical Formula 6 is synthesized according to the same method as the method of synthesizing the disazo compound in Synthesis Example 1. The yield of the dichroic dye is 82%.

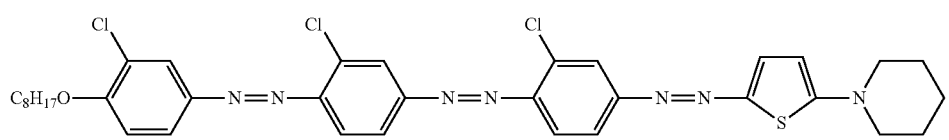

Chemical Formula 6

The structure of the dichroic dye represented by the above Chemical Formula 6 is analyzed by $^1$H NMR (300 MHz, Bruker Co.).

The $^1$H NMR analysis result is provided as follows.

$^1$H NMR (300 MHz. CDCl$_3$) δ(ppm): 0.88 (t, J=6.6 Hz, 3 H, CH$_3$), 1.26-1.39 (m, 8 H, CH$_2$×4), 1.41-1.51 (m, 2 H, CH$_2$), 1.70 (s, 6 H, CH$_2$×3), 1.81-1.97 (m, 2 H, CH$_2$), 3.45 (s, 4 H, NCH$_2$), 4.04 (t, J=6.6 Hz, 2 H, OCH$_2$), 6.19 (s, 1 H, ArH), 7.01 (d, J=8.7 Hz, 2H, ArH), 7.58 (d, J=4.2 Hz, 1H, ArH), 7.83 (d, J=7.8 Hz, 2H, ArH), 7.91-8.05 (m, 8H, ArH).

COMPARATIVE SYNTHESIS EXAMPLE 2

7-1. Synthesis of Monoazo Compound 4.1 g (11.4 mmol) of a monoazo compound is synthesized according to the same method as Synthesis Example 1, except for using 1-bromo octane instead of 1-iodo hexadecane. The yield of the monoazo compound is 81.3%.

7-2. Synthesis of Disazo Compound 1.23 g (2.65 mmol) of a disazo compound is synthesized according to the same method as the method of synthesizing the monoazo compound in Comparative Synthesis Example 1. The yield of the compound is 85%.

7-3. Synthesis of Triazo Compound 480 mg (0.74 mmol) of a dichroic dye represented by the following Chemical Formula 7 is synthesized according to the same method as the method of synthesizing the disazo compound in Synthesis Example 1. The yield of the dichroic dye is 74.7%.

Chemical Formula 7

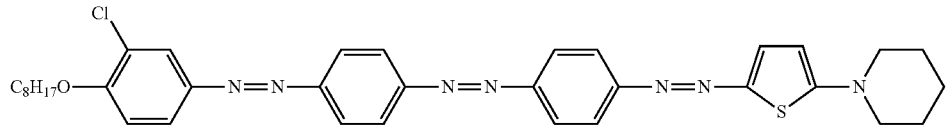

The structure of the dichroic dye represented by above Chemical Formula 7 is analyzed by $^1$H NMR (300 MHz, Bruker Co.).

The $^1$H NMR analysis result is provided as follows.

$^1$H NMR (300 MHz. CDCl$_3$) δ(ppm): 0.89 (t, J=7.0 Hz, 3 H, CH$_3$), 1.25-1.41 (m, 8 H, CH$_2$×4), 1.45-1.52 (m, 2 H, CH$_2$), 1.72 (s, 6 H, CH$_2$×3), 1.81-1.95 (m, 2 H, CH$_2$), 3.46 (s, 4 H, NCH$_2$), 4.13 (t, J=6.5 Hz, 2 H, OCH$_2$), 6.22 (d, J=4.6 Hz, 1 H, ArH), 7.01 (d, J=8.9 Hz, 1 H, ArH), 7.60 (d, J=4.6 Hz, 1 H, ArH), 7.83 (d, J=6.7 Hz, 2 H, ArH), 7.91 (d, J=6.3 Hz, 1 H, ArH), 7.94-8.05 (m, 7 H, ArH).

Evaluation 1: Calculation of Solubility Parameter

Solubility parameters of the dichroic dyes according to Synthesis Examples 1 to 5 and Comparative Synthesis Examples 1 and 2 are calculated.

The solubility parameters are obtained by using a Hildebrand solubility parameter.

Molecules are cohered due to composite bonding action of van der Waals force, dipole moment, and the like, and energy for the cohesion is defined as cohesive energy (Ecoh). This cohesion energy is expressed as internal cohesive energy (Ecoh) change per mol according to the following Relationship Formula 1.

$$E_{coh} = \Delta U = \Delta H - \Delta T \quad \text{Relationship Formula 1}$$

In the Relationship Formula 1, $E_{coh}$ indicates cohesion energy,

ΔU indicates the amount of internal energy change per mol,

ΔH indicates the amount of enthalpy change, and

ΔT indicates the amount of temperature change.

In addition, cohesive energy per unit volume may be defined by cohesive energy density (CED), and the cohesive energy density may be expressed by the following Relationship Formula 2.

$$CED = (\Delta H - RT)/Vm \quad \text{Relationship Formula 2}$$

In the Relationship Formula 2,

CED indicates cohesive energy density,

ΔH indicates enthalpy change amount,

R is a constant,

T is a temperature, and

Vm is a mole volume.

The cohesive energy density is used to define a Hildebrand solubility parameter able to express dissolving capability, and the solubility parameter is calculated by using a density or a mole volume at a particular temperature according to the following Relationship Formula 3.

$$\delta = (CED)^{0.5} = (\Sigma Ecoh_i / \Sigma Vm_i)^{0.5} \quad \text{Relationship Formula 3}$$

In the Relationship Formula 3,

δ is a solubility parameter,

CED is cohesive energy density, $Ecoh_i$ is cohesive energy of a functional group i in a molecule, and $Vm_i$ is a mole volume.

The Hildebrand solubility parameter value used to design the structure of the dichroic dyes may be calculated through group contribution of a molecule.

Group contribution of cohesive energy (Ecoh) and mole volume (Vm) used to calculate the solubility parameter of the dichroic dyes is provided in Table 1. (Reference Article: Polym. Eng. Sci. 1974, 14, 147.; J. Appl. Polym. Sci. 2005, 96, 416.)

TABLE 1

| Group | Ecoh (J/mol) | Vm (cm$^3$/mol) |
|---|---|---|
| —CH$_3$ | 4707 | 33.5 |
| —CH$_2$— | 4937 | 16.1 |
| —CH— | 3431 | −1.0 |
| C | 1464 | −19.2 |
| H$_2$C= | 4310 | 28.5 |
| —CH= | 4310 | 13.5 |
| C= | 4310 | −5.5 |
| Phenyl | 31924 | 71.4 |
| Phenylene (o, m, p) | 31924 | 52.4 |
| Phenyl (trisubstituted) | 31924 | 33.4 |
| Phenyl (tetrasubstituted) | 31924 | 14.4 |
| Phenyl (pentasubstituted) | 31924 | −4.6 |
| Phenyl (hexasubstituted) | 31924 | −23.6 |
| Ring closure 5 or more atoms | 1046 | 16.0 |
| Ring closure 3 or 4 atoms | 3138 | 18.0 |
| —COOH | 27614 | 28.5 |
| —CO$_2$— | 17991 | 18.0 |
| —CO— | 17364 | 10.8 |
| —CONH— | 33472 | 9.5 |
| —NH$_2$ | 12552 | 19.2 |
| —NH— | 8368 | 4.5 |
| N | 4184 | −9.0 |
| —N= | 11715 | 5.0 |
| —N=N— | 4188 | 0.0 |
| —CN | 25522 | 24.0 |
| —NO$_2$ | 15355 | 32.0 |
| —O— | 3347 | 3.8 |
| —OH | 29790 | 10.0 |
| S | 14142 | 12.0 |
| —F | 4184 | 18.0 |
| —Cl | 11548 | 24.0 |
| —Br | 15481 | 30.0 |
| —I | 190373 | 1.5 |

Solubility parameters of the dichroic dyes according to Synthesis Examples 1 to 4 and Comparative Synthesis Examples 1 and 2 calculated by the Hildebrand solubility parameter are provided in Table 2.

TABLE 2

| | Solubility parameter |
|---|---|
| Synthesis Example 1 | 21.7 |
| Synthesis Example 2 | 22.2 |
| Synthesis Example 3 | 22.6 |

TABLE 2-continued

|  | Solubility parameter |
| --- | --- |
| Synthesis Example 4 | 22.1 |
| Synthesis Example 5 | 23.2 |
| Comparative Synthesis Example 1 | 21.8 |
| Comparative Synthesis Example 2 | 22.3 |

Manufacture of Polarizing Film

EXAMPLE 1

A composition for a polarizing film is prepared by mixing a polyolefin (a solubility parameter: 16.6) including polypropylene (PP) and a polypropylene-polyethylene copolymer (PP-PE) in a ratio of 5:5 (w/w) with 0.5 parts by weight of the dichroic dye of Synthesis Example 1 based on 100 parts by weight of the polyolefin.

The composition for a polarizing film is melt-blended at about 250° C. by using a micro-compounder made by DSM. Subsequently, the melt-blended mixture is put in a sheet-shaped mold and pressed at a high temperature with a high pressure to manufacture a film. Then, the film is 1,000% elongated in a uniaxial direction (with a tensile tester made by Instron) at 125° C. to manufacture a polarizing film.

EXAMPLE 2

A polarizing film is manufactured according to the same method as Example 1, except for using the dichroic dye according to Synthesis Example 2 instead of the dichroic dye according to Synthesis Example 1.

EXAMPLE 3

A polarizing film is manufactured according to the same method as Example 1, except for using the dichroic dye according to Synthesis Example 3 instead of the dichroic dye according to Synthesis Example 1.

EXAMPLE 4

A polarizing film is manufactured according to the same method as Example 1, except for using the dichroic dye according to Synthesis Example 4 instead of the dichroic dye according to Synthesis Example 1.

EXAMPLE 5

A polarizing film is manufactured according to the same method as Example 1, except for using the dichroic dye according to Synthesis Example 5 instead of the dichroic dye according to Synthesis Example 1.

COMPARATIVE EXAMPLE 1

A polarizing film is manufactured according to the same method as Example 1, except for using the dichroic dye according to Comparative Synthesis Example 1 instead of the dichroic dye according to Synthesis Example 1.

COMPARATIVE EXAMPLE 2

A polarizing film is manufactured according to the same method as Example 1, except for using the dichroic dye according to Comparative Synthesis Example 2 instead of the dichroic dye according to Synthesis Example 1.

Evaluation 2: Polarization Properties

Polarizing efficiency and dichroic ratios of the polarizing films according to Examples 1 to 5 and Comparative Examples 1 and 2 are evaluated.

The polarizing efficiency and dichroic ratio may be obtained by using transmittance.

The transmittance is obtained by respectively measuring light transmittance of a polarizing film of light parallel to a transmittance axis of the polarizing film and light transmittance of the polarizing film of light perpendicular to the transmittance axis of the polarizing film with a UV-VIS spectrophotometer (V-7100, JASCO).

The transmittance is used to calculate a dichroic ratio (DR) and polarizing efficiency (PE).

The dichroic ratio (DR) is obtained according to the following Equation 1.

$$DR = \text{Log}(1/T_\perp)/\text{Log}(1/T_\parallel) \qquad \text{Equation 1}$$

In Equation 1,

DR denotes a dichroic ratio, $T_\parallel$ is light transmittance of light entering parallel to the transmissive axis of a polarizing film, and $T_\perp$ is light transmittance of light entering perpendicular to the transmissive axis of the polarizing film.

The polarization efficiency may be obtained by the following Equation 2.

$$PE\ (\%) = [(T_\parallel - T_\perp)/(T_\parallel + T_\perp)]^{1/2} \times 100 \qquad \text{Equation 2}$$

In Equation 2,

PE denotes polarization efficiency, $T_\parallel$ is transmittance of light entering parallel to the transmissive axis of a polarizing film, and $T_\perp$ is transmittance of light entering perpendicular to the transmissive axis of the polarizing film.

Figure 4:
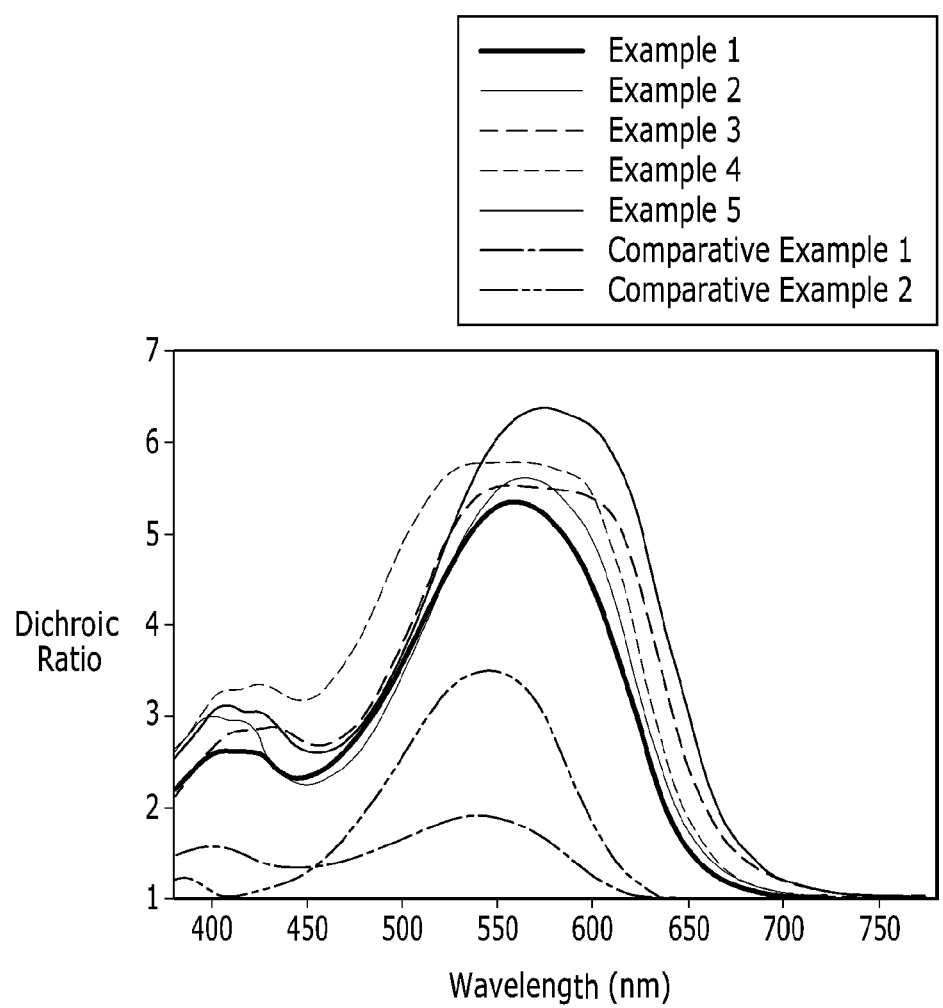
FIG. 4 is a graph of a dichroic ratio versus wavelength (nanometer, nm) showing dichroic ratios in a visible ray region according to the polarizing films according to Examples 1 to 5 and Comparative Examples 1 and 2.

The results are illustrated referring to Table 3 and FIG. 4.

FIG. 4 is a graph showing dichroic ratio of the polarizing films according to Examples 1 to 5 and Comparative Examples 1 and 2 in a visible ray region.

In Table 3, the polarizing efficiency and dichroic ratio of the polarizing films according to Examples 1 to 5 and Comparative Examples 1 and 2 are obtained at a maximum absorption wavelength ($\lambda_{max}$).

TABLE 3

|  | Solubility parameter difference (dye - polyolefin) | λmax (nm) | Polarization efficiency (PE, %) | Dichroic ratio (DR) |
| --- | --- | --- | --- | --- |
| Example 1 | 5.1 | 560 | 99.7 | 5.6 |
| Example 2 | 5.6 | 560 | 99.8 | 5.4 |
| Example 3 | 6.0 | 570 | 99.7 | 5.5 |
| Example 4 | 5.5 | 555 | 99.8 | 5.8 |
| Example 5 | 6.6 | 565 | 99.8 | 6.3 |
| Comparative Example 1 | 5.2 | 535 | 78.7 | 1.9 |
| Comparative Example 2 | 5.7 | 535 | 95.5 | 3.5 |

Referring to Table 3 and FIG. 4, the polarizing films according to Examples 1 to 5 show higher polarizing efficiency and dichroic ratio than Comparative Examples 1 and 2.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A composition for a polarizing film, comprising:
a polyolefin, and
a dichroic dye represented by Chemical Formula 1:

Chemical Formula 1

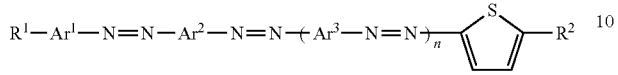

wherein, in Chemical Formula 1, $Ar^1$ to $Ar^3$ are each independently a substituted or unsubstituted phenylene group, a substituted or unsubstituted naphthalene group, or a substituted or unsubstituted biphenylene group, wherein at least two of $Ar^1$ to $Ar^3$ are independently a substituted phenylene group, a substituted naphthalene group, and a substituted biphenylene group substituted with a substituted or unsubstituted C1 to C20 alkyl group, a substituted or unsubstituted C1 to C20 alkoxy group, a halogen atom, or a combination thereof, $R^1$ is a substituted or unsubstituted C1 to C20 alkoxy group or a substituted or unsubstituted C1 to C20 thioalkyl group, $R^2$ is hydrogen, a substituted or unsubstituted C1 to C30 alkyl group, a substituted or unsubstituted C6 to C20 aryl group, a substituted or unsubstituted C1 to C20 alkoxy group, a substituted or unsubstituted C1 to C20 alkylthio group, —$NR^3R^4$, or a combination thereof, wherein $R^3$ and $R^4$ are each independently hydrogen, a substituted or unsubstituted C1 to C10 alkyl group, optionally linked to each other to form a ring, and n is 0 or 1.

2. The composition for a polarizing film of claim 1, wherein $R^1$ of Chemical Formula 1 is a substituted or unsubstituted C4 to C20 alkyl group, $R^2$ of Chemical Formula 1 is hydrogen, a substituted or unsubstituted C1 to C30 alkyl group, —$NR^3R^4$, or a combination thereof, wherein $R^3$ and $R^4$ are each independently hydrogen, a substituted or unsubstituted C1 to C10 alkyl group, optionally linked to each other to form a ring.

3. The composition for a polarizing film of claim 1, wherein the dichroic dye is represented by Chemical Formulae 2 to 5:

Chemical Formula 2

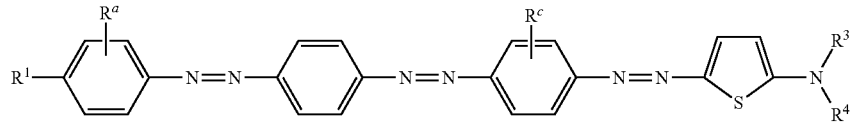

Chemical Formula 3

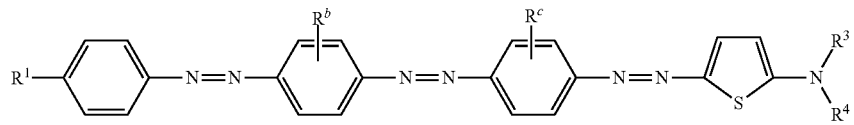

Chemical Formula 4

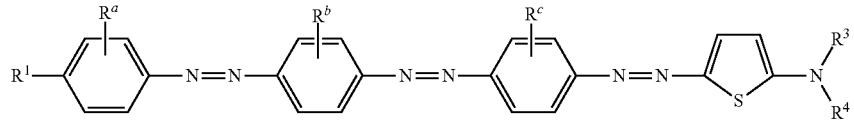

Chemical Formula 5

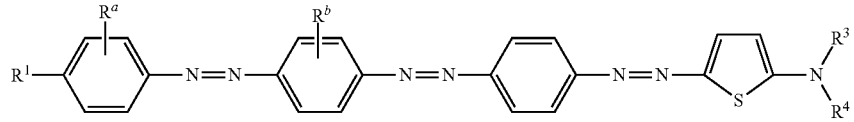

wherein, in Chemical Formulae 2 to 5, $R^1$ is a substituted or unsubstituted C1 to C20 alkoxy group or a substitute or unsubstituted C1 to C20 thioalkly group, $R^3$ and $R^4$ are each independently hydrogen, a substituted or unsubstituted C1 to C20 alkyl group, optionally linked to each other to form a ring, and $R^a$ to $R^c$ are each independently at least one of a substituted or unsubstituted C1 to C20 alkyl group, a substituted or unsubstituted C1 to C20 alkoxy group, a halogen atom, or a halogen-containing group.

4. The composition for a polarizing film of claim 1, wherein the dichroic dye is represented by Chemical Formulae 2a to 4c:

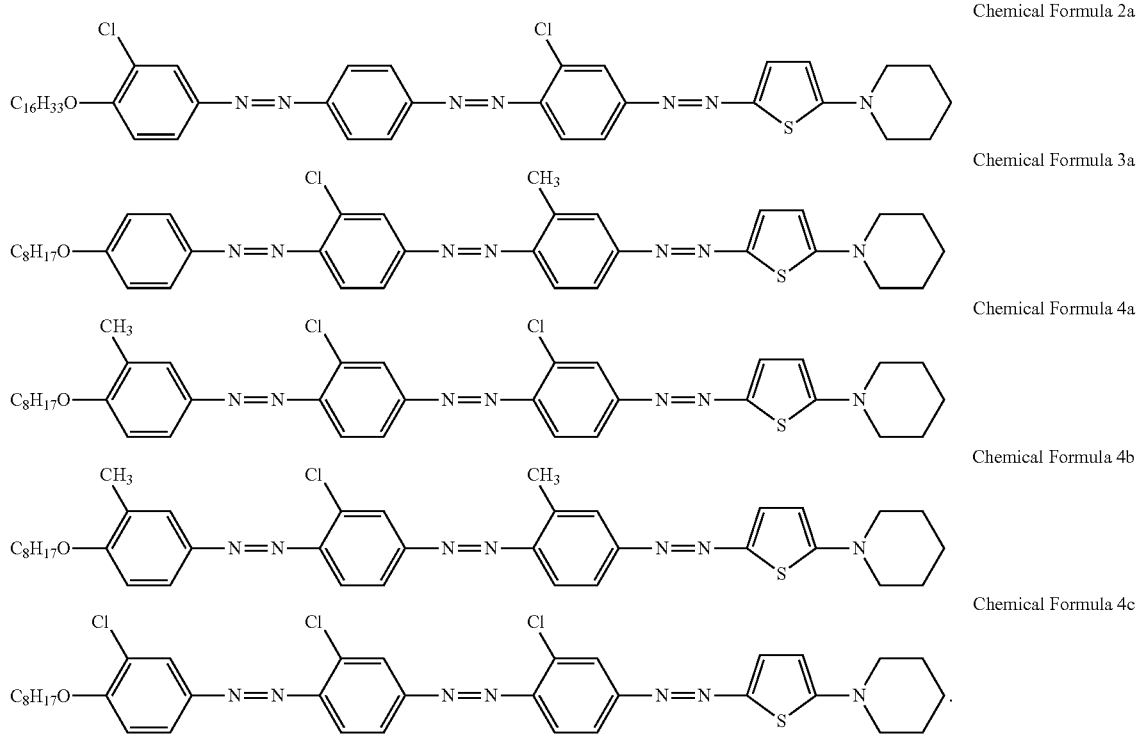

Chemical Formula 2a

Chemical Formula 3a

Chemical Formula 4a

Chemical Formula 4b

Chemical Formula 4c

5. The composition for a polarizing film of claim 1, wherein the polyolefin comprises polyethylene, polypropylene, a copolymer thereof, or a combination thereof.

6. The composition for a polarizing film of claim 5, wherein the polyolefin is a combination of polypropylene and a polyethylene-polypropylene copolymer, and
a weight ratio of the polypropylene and the polyethylene-polypropylene copolymer in the combination is about 4:6 to about 6:4.

7. The composition for a polarizing film of claim 1, wherein the polyolefin has a solubility parameter of about 15 to about 18, and
the dichroic dye has a solubility parameter of less than or equal to about 26.

8. The polarizing film of claim 1, wherein the polyolefin comprises polyethylene, polypropylene, a copolymer thereof, or a combination thereof.

9. The polarizing film of claim 8, wherein the polyolefin is a combination of polypropylene and a polyethylene-polypropylene copolymer, and
a weight ratio of the polypropylene and the polyethylene-polypropylene copolymer in the combination is about 4:6 to about 6:4.

10. A polarizing film comprising:
a polyolefin and
a dichroic dye represented by Chemical Formula 1:

Chemical Formula 1

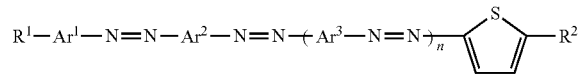

wherein, in Chemical Formula 1, $Ar^1$ to $Ar^3$ are each independently a substituted or unsubstituted phenylene group, a substituted or unsubstituted naphthalene group, or a substituted or unsubstituted biphenylene group, wherein at least two of $Ar^1$ to $Ar^3$ are independently a substituted phenylene group, a substituted naphthalene group, and a substituted biphenylene group substituted with a substituted or unsubstituted C1 to C20 alkyl group, a substituted or unsubstituted C1 to C20 alkoxy group, a halogen atom, or a combination thereof, $R^1$ is a substituted or unsubstituted C1 to C20 alkoxy group or a substituted or unsubstituted C1 to C20 thioalkyl group, $R^2$ is hydrogen, a substituted or unsubstituted C1 to C30 alkyl group, a substituted or unsubstituted C6 to C20 aryl group, a substituted or unsubstituted C1 to C20 alkoxy group, a substituted or unsubstituted C1 to C20 alkylthio group, —$NR^3R^4$, or a combination thereof, wherein $R^3$ and $R^4$ are each independently hydrogen, a substituted or unsubstituted C1 to C10 alkyl group, optionally linked to each other to form a ring, and n is 0 or 1.

11. The polarizing film of claim 10, wherein
$R^1$ of Chemical Formula 1 is a substituted or unsubstituted C4 to C20 alkoxy group, and
$R^2$ of Chemical Formula 1 is hydrogen, a substituted or unsubstituted C1 to C30 alkyl group, —$NR^3R^4$, or a combination thereof, wherein $R^3$ and $R^4$ are each independently hydrogen, a substituted or unsubstituted C1 to C10 alkyl group, optionally linked to each other to form a ring.

12. The polarizing film of claim 10, wherein the dichroic dye is represented by one of Chemical Formulae 2 to 5:

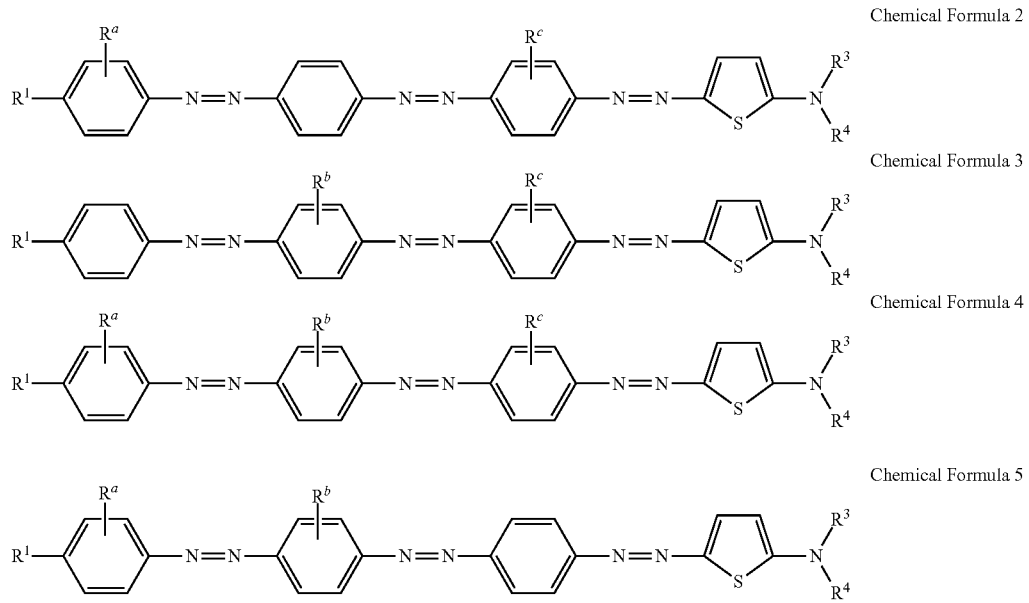

wherein, in Chemical Formulae 2 to 5, $R^1$ is a substituted or unsubstituted C1 to C20 alkoxy group or a substituted or unsubstituted C1 to C20 thioalkly group, $R^3$ and $R^4$ are each independently hydrogen, a substituted or unsubstituted C1 to C20 alkyl group, optionally linked to each other to form a ring, and $R^a$ to $R^c$ are each independently at least one selected from a substituted or unsubstituted C1 to C20 alkyl group, a substituted or unsubstituted C1 to C20 alkoxy group, a halogen atom, and a halogen-containing group.

13. The polarizing film of claim 10, wherein the dichroic dye is represented by one of Chemical Formulae 2a to 4c:

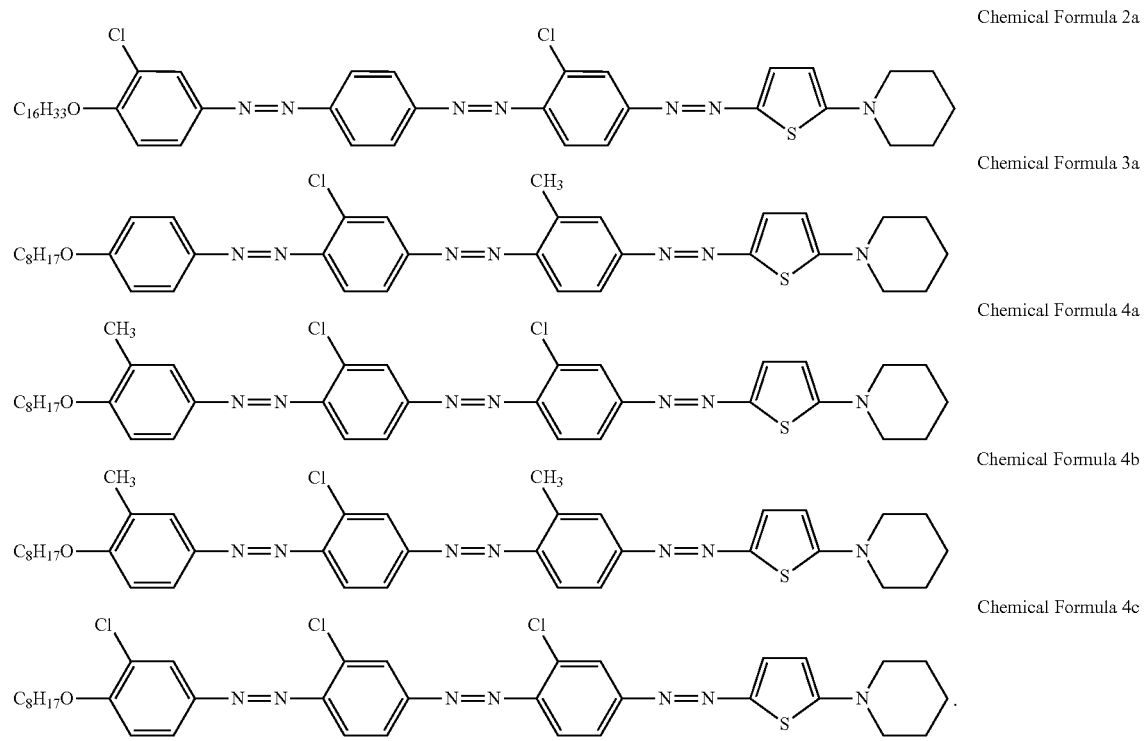

14. The polarizing film of claim 10, wherein the polyolefin has a solubility parameter of about 15 to about 18, and the dichroic dye has a solubility parameter of less than or equal to about 26.

15. The polarizing film of claim 10, wherein the polarizing film has a dichroic ratio of about 5 to about 10 at a maximum absorption wavelength ($\lambda_{max}$) in a visible ray region, wherein the dichroic ratio is obtained by Equation 1:

$$DR = Log(1/T_\perp)/Log(1/T_\parallel) \quad \text{Equation 1}$$

wherein, in Equation 1,

DR denotes a dichroic ratio of a polarizing film, $T_\parallel$ is transmittance of light entering parallel to the transmissive axis of a polarizing film, and $T_\perp$ is transmittance of light entering perpendicular to the transmissive axis of the polarizing film.

16. The polarizing film of claim 10, wherein the polarizing film is a melt blend of the polyolefin and the dichroic dye.

17. A display device, comprising:

a display panel, and the polarizing film according to claim 10 positioned on at least one side of the display panel.

18. The display device of claim 17, wherein the display panel comprises an organic light emitting display panel or a liquid crystal display panel.

* * * * *